United States Patent
Oota

(10) Patent No.: US 8,957,678 B2
(45) Date of Patent: Feb. 17, 2015

(54) SENSOR UNIT AND MAGNETIC FLUX CONCENTRATING MODULE

(75) Inventor: Shinsuke Oota, Kariya (JP)

(73) Assignee: Denso Corporation, Kariya (JP)

(*) Notice: Subject to any disclaimer, the term of this patent is extended or adjusted under 35 U.S.C. 154(b) by 272 days.

(21) Appl. No.: 13/042,665

(22) Filed: Mar. 8, 2011

(65) Prior Publication Data

US 2011/0221432 A1    Sep. 15, 2011

(30) Foreign Application Priority Data

Mar. 12, 2010 (JP) ................... 2010-055499

(51) Int. Cl.
*G01R 33/06* (2006.01)
*G01L 3/10* (2006.01)
*G01R 33/00* (2006.01)
*G01R 33/07* (2006.01)

(52) U.S. Cl.
CPC ............ *G01L 3/104* (2013.01); *G01R 33/0011* (2013.01); *G01R 33/072* (2013.01)
USPC ...................... 324/251; 324/207.2; 73/862.08; 73/862.331

(58) Field of Classification Search
CPC .................................................. G01R 33/072
USPC ............................................... 324/207.2, 251
See application file for complete search history.

(56) References Cited

U.S. PATENT DOCUMENTS

| 6,111,401 | A * | 8/2000 | Mierzwinski | 324/173 |
| 7,893,578 | B2 * | 2/2011 | Hayashi et al. | 310/68 B |
| 8,015,885 | B2 | 9/2011 | Arita et al. | |
| 2004/0085062 | A1 * | 5/2004 | Miyata et al. | 324/207.2 |
| 2005/0223820 | A1 * | 10/2005 | Murakami et al. | 73/862.331 |
| 2006/0021451 | A1 * | 2/2006 | Ishihara et al. | 73/862.331 |
| 2006/0144166 | A1 * | 7/2006 | Ruehl et al. | 73/862.331 |
| 2007/0170533 | A1 * | 7/2007 | Doogue et al. | 257/422 |
| 2008/0013298 | A1 * | 1/2008 | Sharma et al. | 361/813 |
| 2009/0278526 | A1 | 11/2009 | Yoshida | |
| 2010/0033175 | A1 * | 2/2010 | Boeve et al. | 324/252 |
| 2011/0234215 | A1 * | 9/2011 | Ausserlechner | 324/244 |

FOREIGN PATENT DOCUMENTS

| JP | U-1-129678 | 9/1989 |
| JP | H04-012237 | 1/1992 |

(Continued)

OTHER PUBLICATIONS

Japanese Office Action dated Mar. 13, 2012, issued in corresponding Japanese Application No. 2010-055499, with English translation.

(Continued)

*Primary Examiner* — Jay Patidar
*Assistant Examiner* — David M. Schindler
(74) *Attorney, Agent, or Firm* — Nixon & Vanderhye P.C.

(57) ABSTRACT

A sensor unit includes a printed circuit board, a Hall IC, a terminal member, and a capacitor. The printed circuit board has a conductive pattern. The Hall IC is disposed on the printed circuit board. The Hall IC includes an element part that detects magnetic flux. The element part is arranged in parallel with the printed circuit board and is away from the conductive pattern. The terminal member is disposed on an end portion of the printed circuit board and is configured to be electrically coupled with an external device. The capacitor is disposed on the printed circuit board.

6 Claims, 8 Drawing Sheets

(56) References Cited

FOREIGN PATENT DOCUMENTS

| | | | |
|---|---|---|---|
| JP | 5-72152 | | 9/1993 |
| JP | 11-017311 | | 1/1999 |
| JP | 11142184 A | * | 5/1999 |
| JP | P2006-258592 A | | 9/2006 |
| JP | 4046049 | | 11/2007 |
| JP | P2009-271055 A | | 11/2009 |

OTHER PUBLICATIONS

Korean Office Action dated Sep. 3, 2012, issued in corresponding Korean Application No. 10-2011-0017451, with English translation.

Office Action (7 pages) dated Jan. 5, 2013 issued in corresponding Chinese Application No. 201110060512.3 and English translation (9 pages).

* cited by examiner

SENSOR UNIT AND MAGNETIC FLUX CONCENTRATING MODULE

CROSS REFERENCE TO RELATED APPLICATIONS

The present application is based on and claims priority to Japanese Patent Application No. 2010-55499 filed on Mar. 12, 2010, the contents of which are incorporated in their entirety herein by reference.

BACKGROUND OF THE INVENTION

1. Field of the Invention

The present invention relates to a sensor unit and a magnetic flux concentrating module including the sensor unit.

2. Description of the Related Art

Many vehicles include an electric power steering (EPS) system. The EPS system is driven at a time when a steering wheel is operated. Thus, the EPS system has advantages, such as improvement of fuel efficiency, compared with a hydraulic power steering system.

In the EPS system, a torque detecting device is used for detecting a torque generated due to a steering operation by a driver as described, for example, in Japanese Patent No. 4,046,049.

The torque detecting device includes, for example, a multipolar magnet, a yoke, and a magnetic flux concentrating ring. In the multipolar magnet, an N pole and an S pole are alternately arranged on a cylindrical surface. The yoke is disposed at a periphery of the multipolar magnet. The magnetic flux concentrating ring is disposed at a periphery of the yoke.

The magnetic flux concentrating ring concentrates magnetic flux through teeth of the yoke disposed at the periphery of the multipolar magnet. At an end portion of the magnetic flux concentrating ring, protruding parts protrudes radially outward. The protruding parts have a clearance therebetween in a vertical direction. Between the protruding parts, a Hall IC is disposed. The torque detecting device detects a change in the torque as a change in magnetic flux passing through the Hall IC.

In the conventional art, components including the Hall IC are welded to a bus bar that is called a terminal. Specifically, the bus bar is bent into an L-shape by press working. The Hall IC is treated with projection welding. After a capacitor is soldered and an epoxy molding is performed, a harness is treated with resistance welding. Then, a hot melt molding is performed in such a manner that stress does not concentrate at a welding portion of the harness, and thereby a sensor unit including the Hall IC is formed. The above-described process is performed so as to improve a detection accuracy of the Hall IC.

However, the above-described process requires a long time. Furthermore, because the bus bar bent into the L-shape is used and the Hall IC protrudes from the bus bar, a dimension of the sensor unit is large.

SUMMARY OF THE INVENTION

In view of the foregoing problems, it is an object of the present invention to provide a sensor unit that can reduce a manufacturing time and a dimension. Another object of the present invention is to provide a magnetic flux concentrating module including the sensor unit.

A sensor unit according to an aspect of the present invention includes a printed circuit board, a Hall IC, a terminal member, and a capacitor. The printed circuit board has a conductive pattern. The Hall IC is disposed on the printed circuit board and the Hall IC includes an element part that detects magnetic flux. The element part is arranged in parallel with the printed circuit board and is away from the conductive pattern. The terminal member is disposed on an end portion of the printed circuit board and is configured to be electrically coupled with an external device. The capacitor is disposed on the printed circuit board.

The sensor unit can be manufactured by disposing the Hall IC, the terminal member, and the capacitor on the printed circuit board. Thus, a press working of a bus bar, a projection welding of a Hall IC, and a resistance welding of a harness, which are required in a manufacturing process of the conventional sensor unit, are not required and a time required for manufacturing the sensor unit can be reduced compared with conventional sensor unit. Furthermore, because the Hall IC is disposed on the printed circuit board in such a manner that the element part is arranged in parallel with the printed circuit board, a dimension of the sensor unit can be reduced.

A magnetic flux concentrating module according to another aspect of the present invention includes the sensor unit, a magnetic flux concentrating ring, a shield, and an outer frame. The magnetic flux concentrating ring includes a plurality of protruding portions. One of the protruding portions and another one of the protruding portions are arranged on opposite sides of the Hall IC. The shield covers the magnetic flux. The outer frame is made of resin.

BRIEF DESCRIPTION OF THE DRAWINGS

Additional objects and advantages of the present invention will be more readily apparent from the following detailed description of preferred embodiments when taken together with the accompanying drawings. In the drawings:

FIG. 90 is a side view of the sensor unit viewed from a direction shown by arrow IXC in FIG. 9A.

DETAILED DESCRIPTION OF THE PREFERRED EMBODIMENTS (First Embodiment)

A magnetic flux concentrating module 1 according to a first embodiment of the present invention will be described with reference to FIG. 1 to FIG. 6C. The magnetic flux concentrating module 1 can form a part of a torque detecting device used for an EPS system. The torque detecting device includes, for example, a multipolar magnet, a yoke, and a magnetic flux concentrating ring 20. In the multipolar magnet, an N pole and an S pole are alternately arranged on a cylindrical surface. The yoke is disposed at a periphery of the multipolar magnet. The magnetic flux concentrating ring 20 is disposed at a periphery of the yoke.

The magnetic flux concentrating module 1 includes the magnetic flux concentrating ring 20 and a sensor unit 30 which are integrated.

Figure 1:
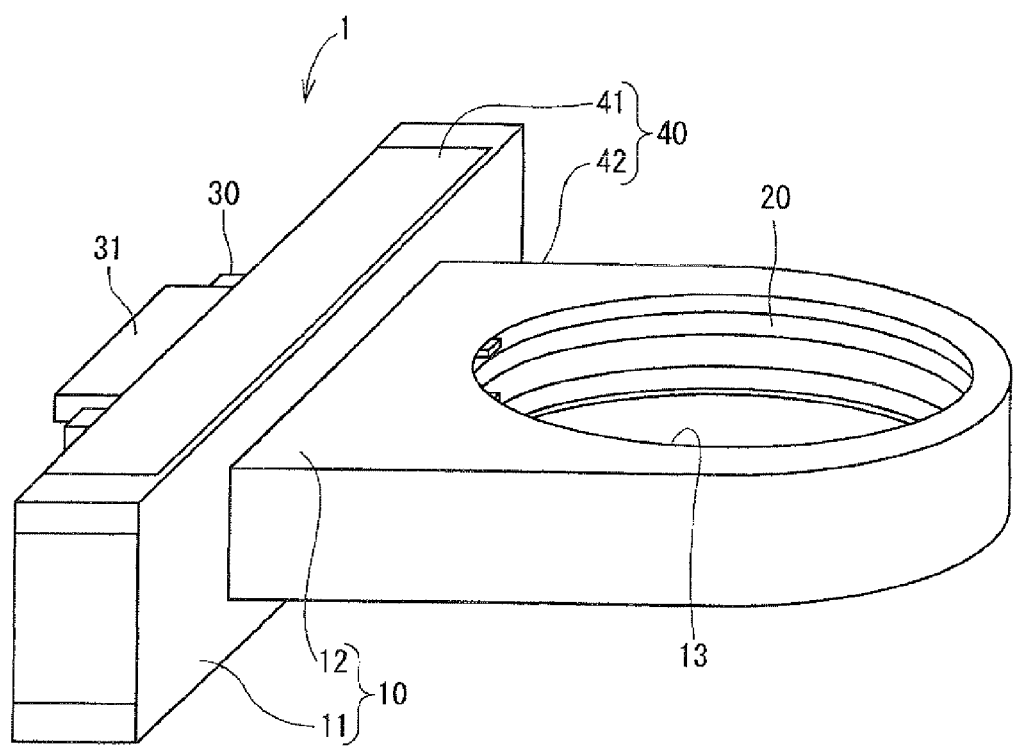
FIG. 1 is a perspective view of a magnetic flux concentrating module according to a first embodiment of the present invention.

As shown in FIG. 1, the magnetic flux concentrating module 1 includes an outer frame 10, the magnetic flux concentrating ring 20, the sensor unit 30, and a shield 40. The outer frame 10 is made of resin. The outer frame 10 includes a base portion 11 having a rectangular parallel piped shape and a projecting portion 12 protruding from a side surface of the base portion 11. The protruding portion 12 includes a hole 13 where the multipolar magnet and the yoke are inserted. An edge of the protruding portion 12 has an arc shape corresponding to a shape of the hole 13.

Figure 2:
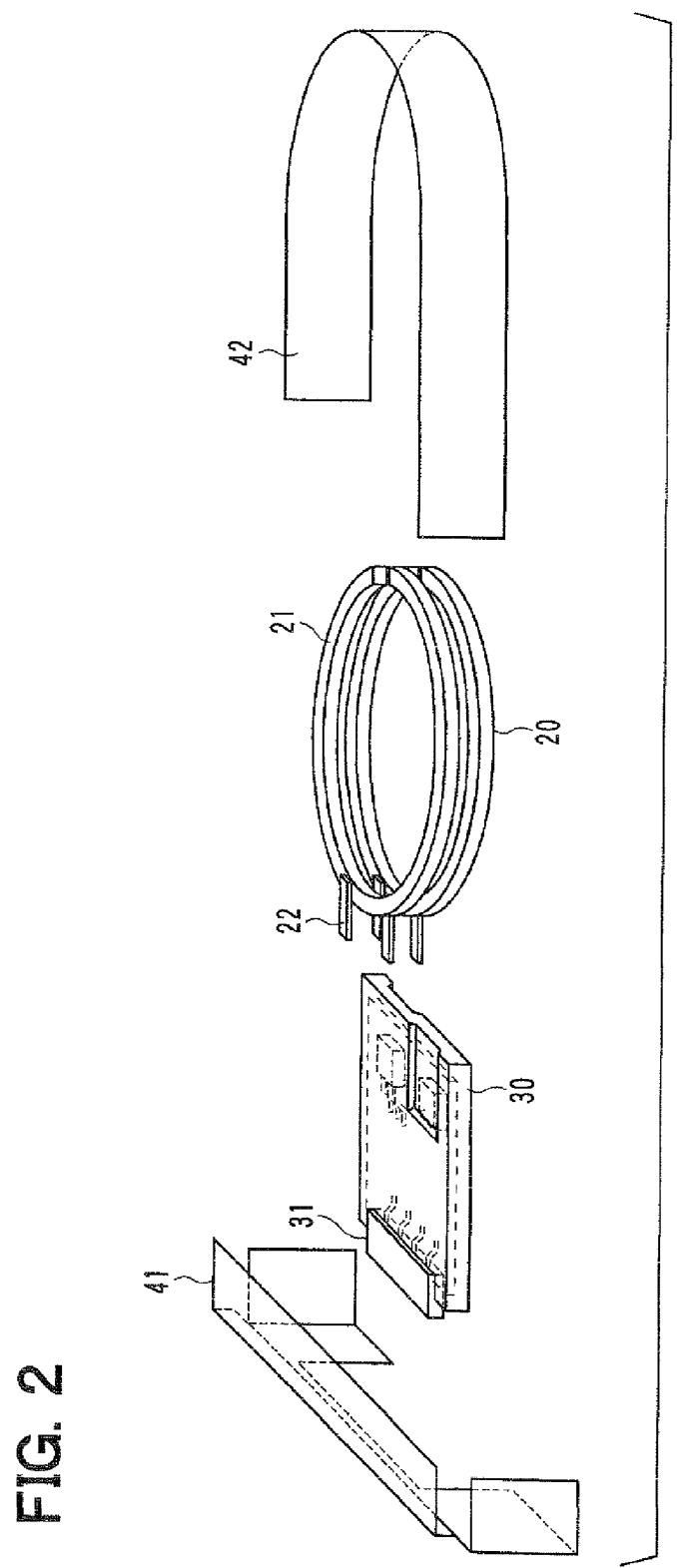
FIG. 2 is an exploded perspective view of the magnetic flux concentrating module without an outer frame.

The magnetic flux concentrating ring 20 is embedded in a cylindrical part of the protruding portion 12. As shown in FIG. 2, the magnetic flux concentrating ring 20 includes two ring portions 21 and four protruding portions 22. The two ring portions 21 are arranged in a vertical direction. The protruding portions 22 protrude outward from the ring portions 21. Each of the ring portions 21 is attached with two protruding portions 22 that are arranged in a vertical direction so as to correspond to the sensor unit 30.

The sensor unit 30 is mostly embedded in the base portion 11, and a portion of the sensor unit 30 protrudes from the base portion 11 in an opposite direction from the protruding portion 12 of the outer frame 10. The portion of the sensor unit 30 protruding from the base portion 11 is attached with a connector 31.

The shield 40 includes a base shield 41 and a protruding shield 42. The base shield 41 covers the base portion 11 of the outer frame 10. The protruding shield 42 covers the protruding portion 12 of the outer frame 10. As shown in FIG. 2, the base shield 41 covers side surfaces and an upper surface of the outer frame 10 and a protruding surface of the sensor unit 30. The protruding shield 42 has a U-shape and covers an outer surface of the protruding portion 12. The base shield 41 and the protruding shield 42 restrict factors that adversely affect accuracy. The shield 40 may be integrated when the outer frame 10 is formed. The shield 40 may also be fit to the outer frame 10 after the outer frame 10 is formed.

Figure 3:
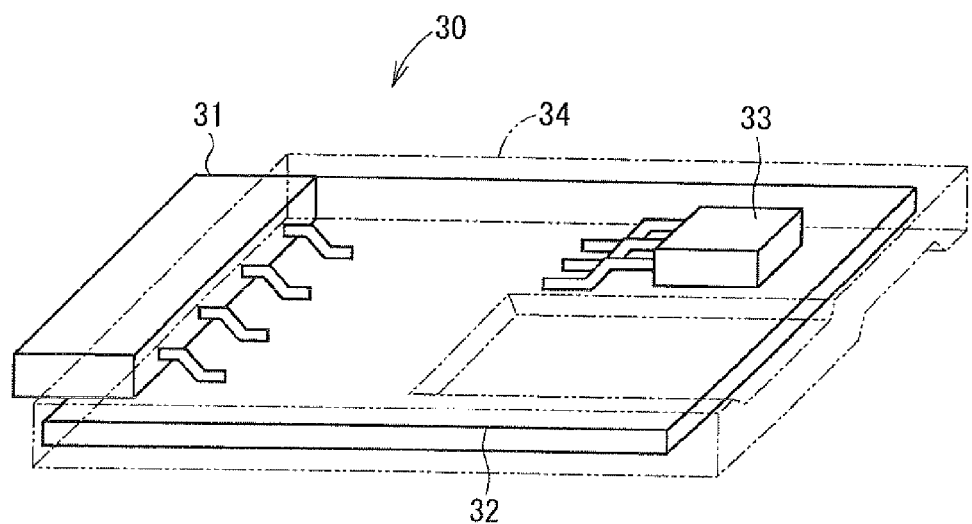
FIG. 3 is a perspective view of a sensor unit according to the first embodiment.

As shown in FIG. 3, the sensor unit 30 includes the connector 31, a printed circuit board 32, and two Hall ICs 33. The connector 31 and the Hall ICs 33 are disposed on the printed circuit board 32. The sensor unit 30 is molded with a resin member 34 as shown by dashed-two dotted line.

Figure 4:
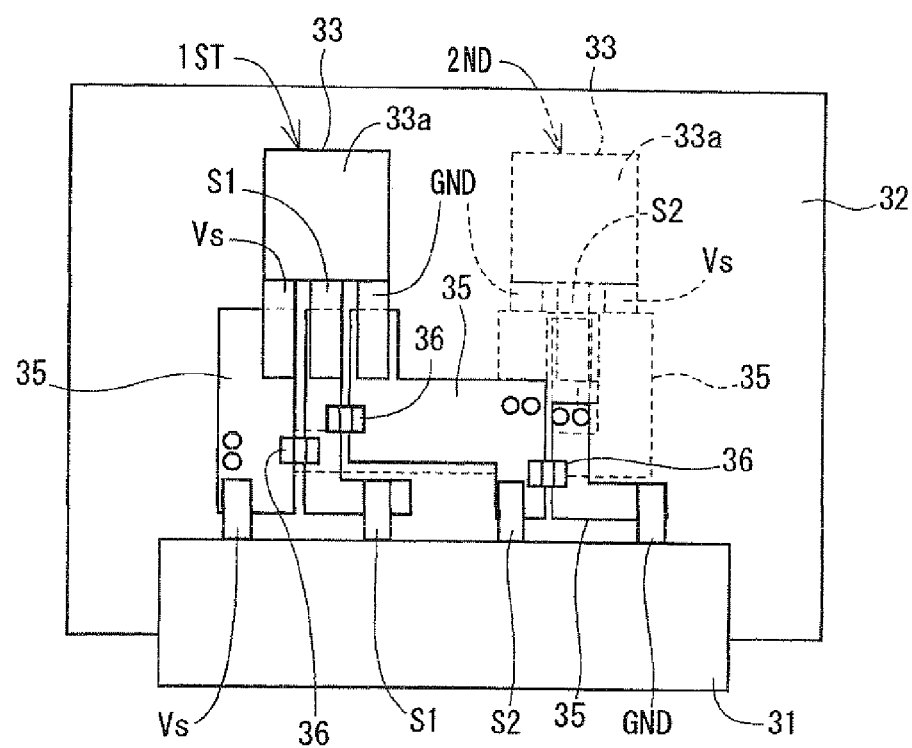
FIG. 4 is a diagram showing the sensor unit according to the first embodiment before molded with resin.

As shown in FIG. 4, the printed circuit board 32 has a copper foil pattern 35. The Hall ICs 33, the connector 31, and a plurality of capacitors 36 are soldered to the copper foil pattern 35. The Hall ICs 33 include a first Hall IC (1ST) 33 and a second Hall IC (2ND) 33.

Figure 5A:
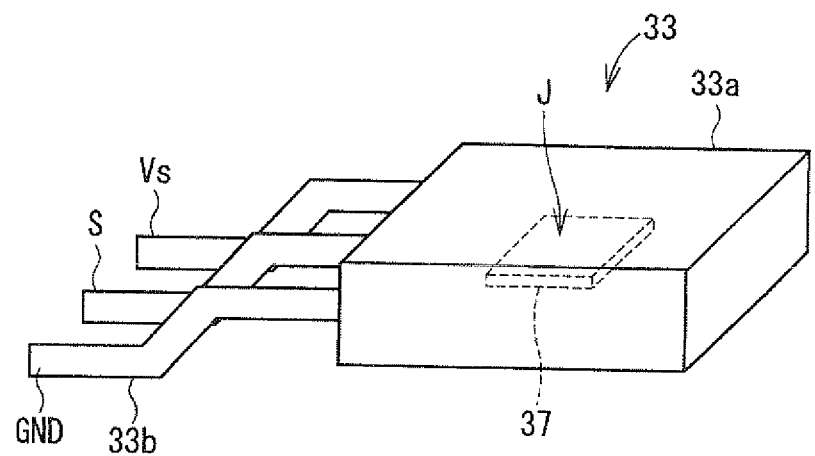
FIG. 5A is a perspective view of a Hall IC according to the first embodiment.

As shown in FIG. 5A, each of the Hall ICs 33 includes an element part 33a in which a sensing element 37 is embedded, and a lead portion 33b. In general, the element part 33a has a plate shape corresponding to the sensing element 37. The element part 33a is arranged in parallel with the printed circuit and is away from the copper foil pattern 35. In other words, the element part 33a is not opposite to the copper foil pattern 35.

As shown in FIG. 5A, the lead portion 33b includes a Vs terminal, an S terminal, and a GND terminal. The Vs terminal is a power supply terminal. The S terminal is a sensor output terminal. The GND terminal is a ground terminal. Each of the terminals is bent to an opposite direction from a front surface of the sensing element 37 shown by J. In the present embodiment, the bending direction of the terminals of the first Hall IC 33 is same as the bending direction of the terminals of the second Hall IC.

As shown in FIG. 4, the first Hall IC 33 includes the Vs terminal, an S1 terminal, and the GND terminal. The second Hall IC 33 includes the Vs terminal, an S2 terminal, and the GND terminal. The S1 terminal and the S2 terminal are the sensor output terminals. The Vs terminal of the first Hall IC 33 and the Vs terminal of the second Hall IC 33 are commonly-provided by the copper foil pattern 35. The GND terminal of the first Hall IC 33 and the GND terminal of the second Hall IC 33 are commonly-provided by the copper foil pattern 35. Accordingly, the connector 31 includes four terminals, that is, the Vs terminal, the S1 terminal, the S2 terminal, and the GND terminal. In the present embodiment, the copper foil pattern 35 is not formed at a portion corresponding to the element parts 33a of the Hall ICs 33.

Figure 6A:
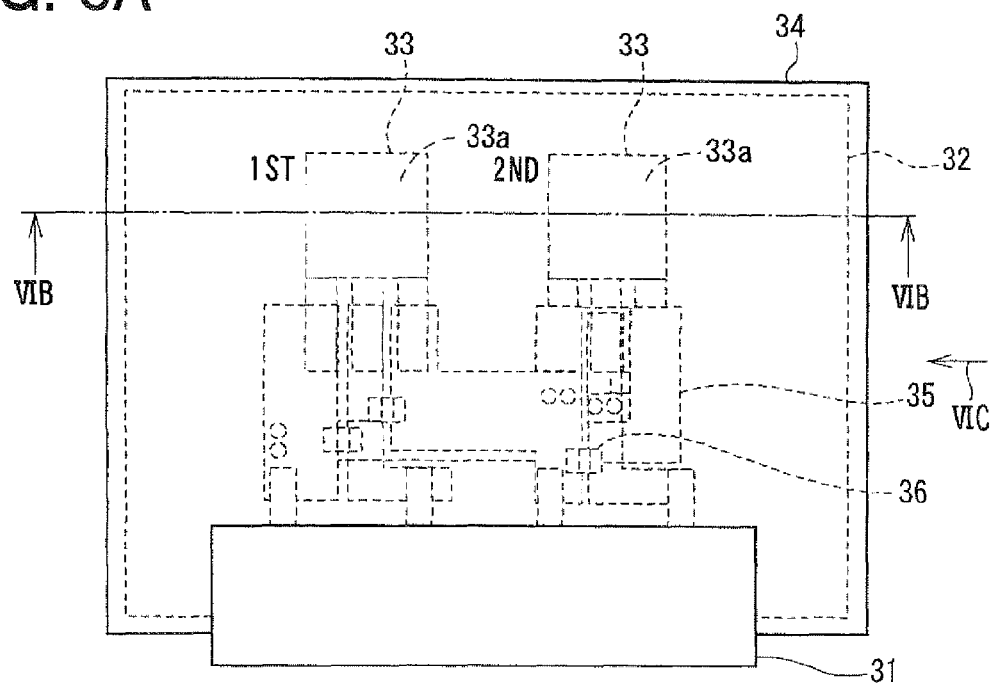
FIG. 6A is a top view of the sensor unit according to the first embodiment after molded with resin.
Figure 6B:
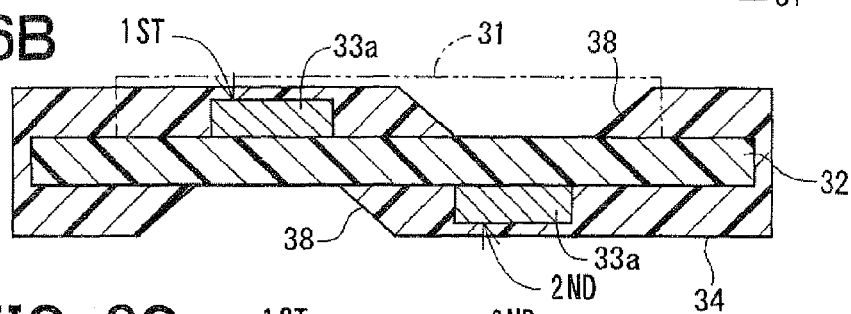
FIG. 6B is a cross-sectional view of the sensor unit taken along line VIB-VIB in FIG. 6A.
Figure 6C:
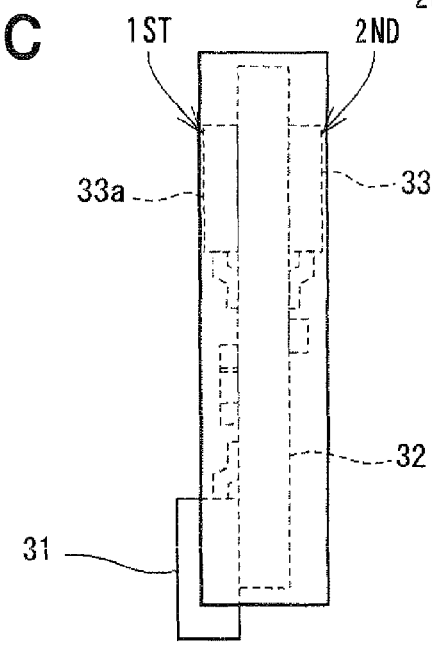
FIG. 6C is a side view of the sensor unit viewed from a direction shown by arrow VIC in FIG. 6A.

The sensor unit 30 is molded with resin as shown by dashed-two dotted line. In other words, the resin member 34 is formed as shown in FIG. 6A and FIG. 6B. The connector 31 is exposed to an outside of the resin member 34 from a front surface and an upper surface of the resin member 34. The Hall ICs 33 and the capacitors 36 are embedded in the resin member 34 as shown in FIG. 6A and FIG. 6C. Thus, the resin member 34 covers the Hall ICs 33, a portion of the connector 31 connected with the printed circuit board 32, and the capacitors 36.

As shown in FIG. 6B, the first Hall IC 33 is disposed on a front surface of the printed circuit board 32, and the second Hall IC 33 is disposed on a rear surface of the printed circuit board 32. The resin member 34 has grooves 38 at portions corresponding to the element parts 33a of the first Hall IC 33 and the second Hall IC 33. Each of the grooves 38 has a trapezoidal cross section. The protruding portions 22 of the magnetic flux concentrating ring 20 are arranged in such a manner that each of the Hall ICs 33 is disposed between the two protruding portions 22. In other words, one of the protruding portions 22 and another one of the protruding portions 22 are arranged on opposite sides of one of the Hall ICs 33. Because of the grooves 38, clearances between the protruding portions 22 of the magnetic flux concentrating ring 20 and the Hall ICs 33 are reduced.

As described above, the sensor unit 30 is formed by soldering the connector 31, the Hall ICs 33 and the capacitors 36 to the printed circuit board 32. Thus, for example, by using a surface mount device (SMD), the sensor unit 30 can be formed by disposing the connector 31, the Hall ICs 33, and the capacitors 36 on the printed circuit board 32 and passing the printed circuit board 32 in a reflow furnace.

Thus, a press working of a bus bar, a projection welding of a Hall IC, and a resistance welding of a harness, which are required in a manufacturing process of the conventional sensor unit, are not required and a time required for manufacturing the sensor unit 30 can be reduced compared with conventional sensor unit. A through-hole device (THD) may also be used instead of the SMD. Also in a case where the THD is used, the time required for manufacturing the sensor unit 30 can be reduced.

In the present embodiment, each of the Hall ICs 33 is disposed on the printed circuit board 32 in such a manner that the element part 33*a* is arranged in parallel with the printed circuit board 32. Because each of the element parts 33*a* has the plate shape, the height of the printed circuit board 32 can be reduced by arranging the element part 33*a* in parallel with the printed circuit board 32. Thus, the sensor unit 30 can have a thin shape centering on the printed circuit board 32, and the dimension of the sensor unit 30 can be reduced compared with the conventional sensor unit.

In the present embodiment, the first Hall IC 33 is disposed on the front surface of the printed circuit board 32, and the second Hall IC 33 is disposed on the rear surface of the printed circuit board 32. Because the sensor output can be acquired from the two Hall ICs 33, the detection accuracy can be improved.

The first Hall IC 33 is disposed on the front surface of the printed circuit board 32 in such a manner that the front surface of the sensing element 37 shown by J is in an upward direction. The second Hall IC 33 is disposed on the rear surface of the printed circuit board 32 in such a manner that a rear surface of the sensing element 37 being opposite to the front surface shown by J is in the upward direction. Thus, the two sensor outputs having opposite phases can be acquired. Furthermore, because the first Hall IC 33 and the second Hall IC 33 are respectively disposed on the front surface and the rear surface of the printed circuit board 32, the first Hall IC 33 and the second Hall IC 33 can have the same shape (see FIG. 5A), and the first Hall IC 33 and the second Hall IC 33 are not required to be handled distinctly.

In the present embodiment, the printed circuit board 32 is molded with the resin member 34. Thus, the connector 31, the Hall ICs, and the capacitors 36 can be protected. For example, in the connector 31, a stress concentration to terminal connected portions can be restricted.

As shown in FIG. 6A, the resin member 34 is formed in such a manner that the portions of the resin member 34 corresponding to the element parts 33*a* of the Hall ICs 33 are thinner than the other portion of the resin member 34. For example, the resin member 34 has the grooves 38, which has the trapezoidal cross section, on the opposite side of the printed circuit board 32 from the Hall ICs 33. Accordingly, the clearance between the protruding portions 22 of the magnetic flux concentrating ring 20 and the Hall ICs 33 can be reduced, and the detection accuracy of the Hall ICs 33 can be improved.

In the present embodiment, the copper foil pattern 35 can function as a conductive pattern, the connector 31 can function as a terminal member, and the grooves 38 can function as recess portions.

(Second Embodiment)

A sensor unit 300 according to a second embodiment of the present invention will be described with reference to FIG. 7. In the sensor unit 300, a configuration of a printed circuit board 320 is different from a printed circuit board 32 described in the first embodiment. Thus, the configuration of the printed circuit board 320 will be described below. The same reference numbers are given to the same components as the first embodiment and explanation of the same components is omitted.

Figure 7:
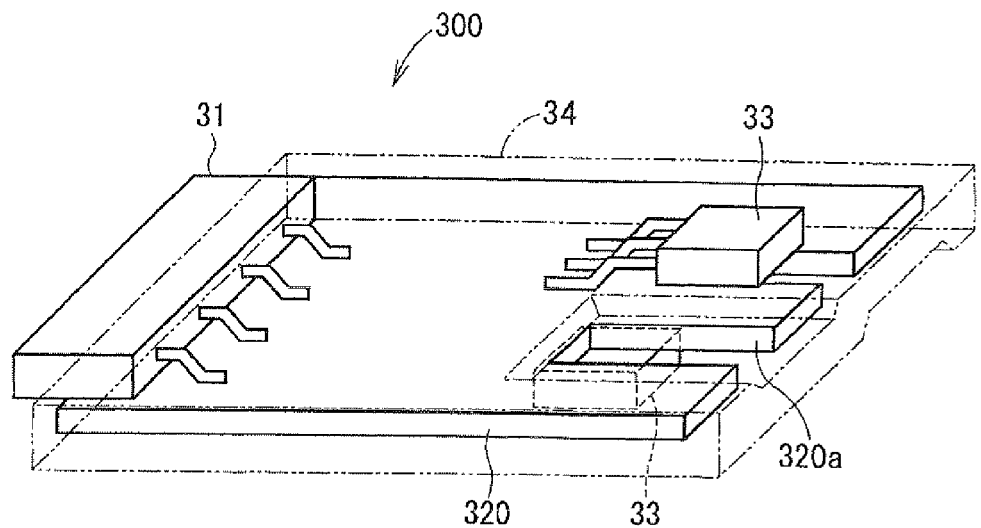
FIG. 7 is a perspective view of a sensor unit according to a second embodiment of the present invention.

As shown in FIG. 7, the printed circuit board 320 has two cutout portions 320*a* provided from an end of the printed circuit board 320. The two cutout portions 320*a* are provided at portions corresponding to the two Hall ICs 33.

Figure 8:
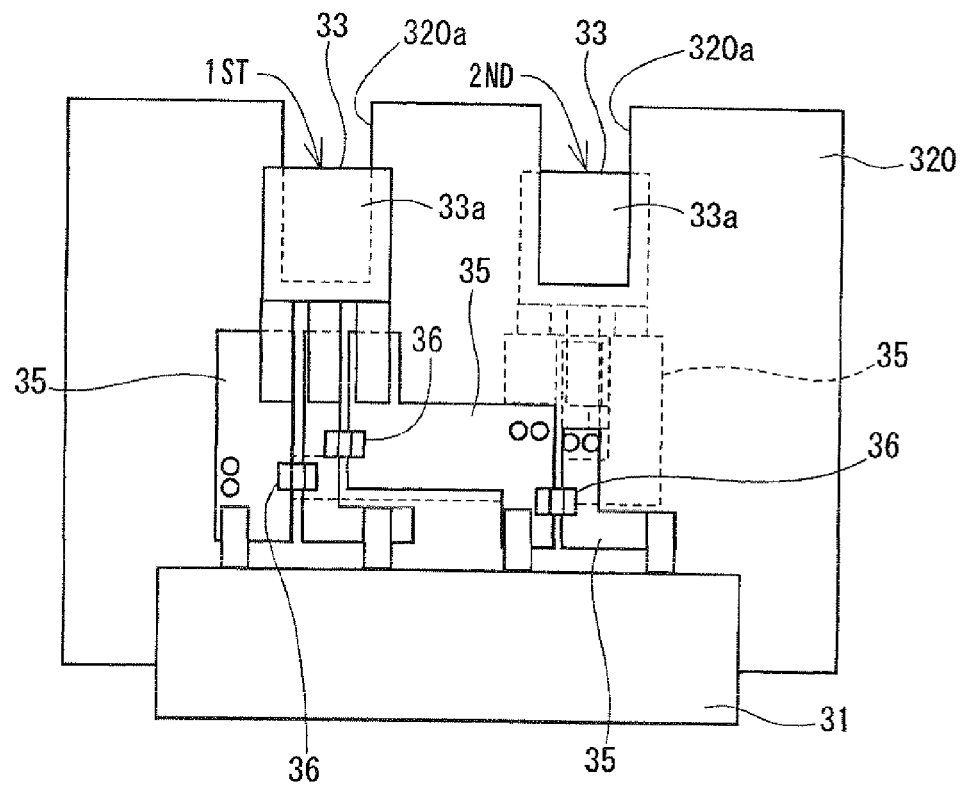
FIG. 8 is a diagram showing the sensor unit according to the second embodiment before molded with resin.

As shown in FIG. 8, the printed circuit board 320 has the copper foil pattern 35. The connector 31, the two Hall ICs 33, and the capacitors 36 are soldered to the copper foil pattern 35.

Also in the present embodiment, the first Hall IC 33 is disposed on a front surface of the printed circuit board 32 and the second Hall IC 33 is disposed on a rear surface of the printed circuit board 32. Electrical connections are same as the first embodiment. As shown in FIG. 8, the cutout portions 320*a* are provided at portions corresponding to the element parts 33*a* of the Hall ICs 33.

Figure 9A:
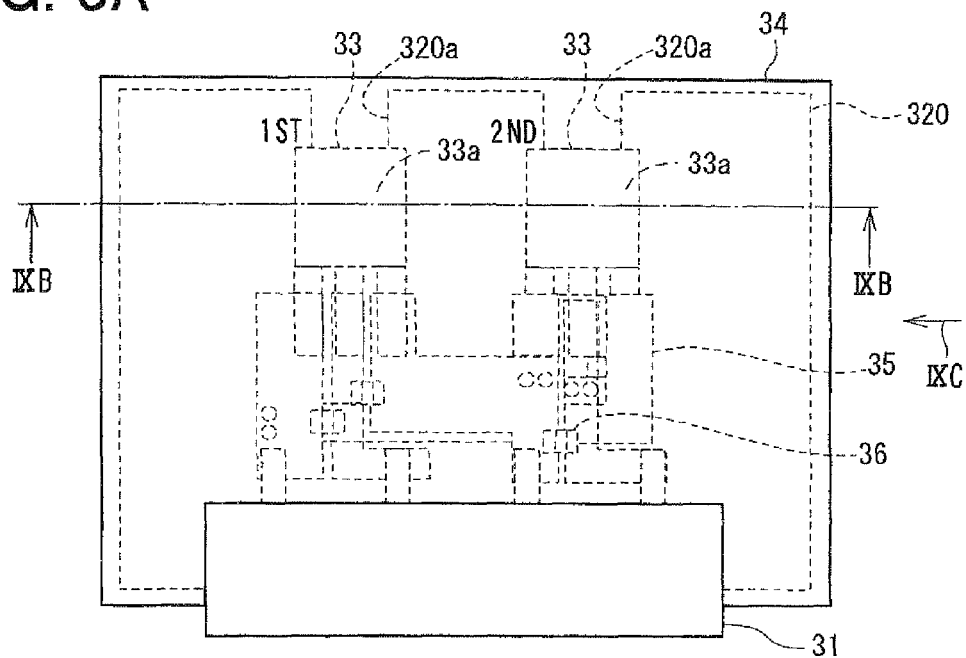
FIG. 9A is a top view of the sensor unit according to the second embodiment after molded with resin.
Figure 9B:
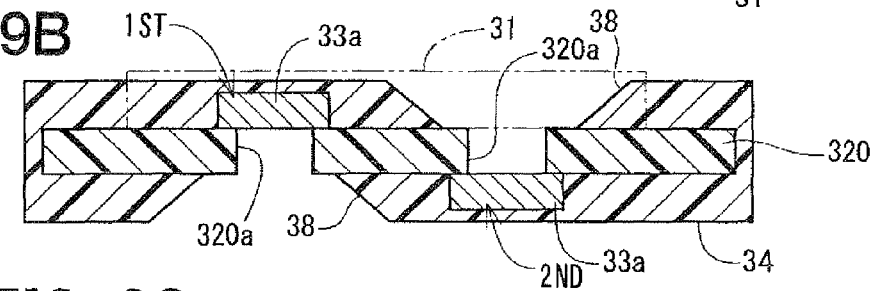
FIG. 9B is a cross-sectional view of the sensor unit taken along fine IXB-IXB in FIG. 9A.
Figure 9C:
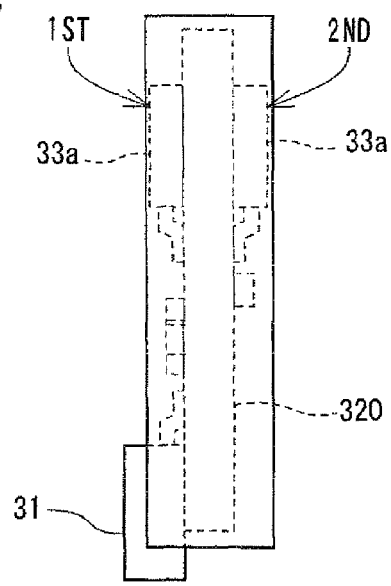

As shown in FIG. 9B, the first Hall IC 33 is disposed on the front surface of the printed circuit board 320 and the second Hall IC 33 is disposed on the rear surface of the printed circuit board 320. The resin member 34 has the grooves 38 at portions corresponding to the first Hall IC 33 and the second Hall IC 33, and each of the grooves 38 has the trapezoidal cross section.

Also in the present configuration, effects similar to the first embodiment can be achieved. Furthermore, because the printed circuit board 320 has the cutout portions 320*a*, the permeability of magnetic flux at the element parts 33*a* of the Hall ICs 33 can be improved and the detection accuracy can be improved.

(Other Embodiments)

Although the present invention has been fully described in connection with the preferred embodiments thereof with reference to the accompanying drawings, it is to be noted that various changes and modifications will become apparent to those skilled in the art.

Figure 10A:
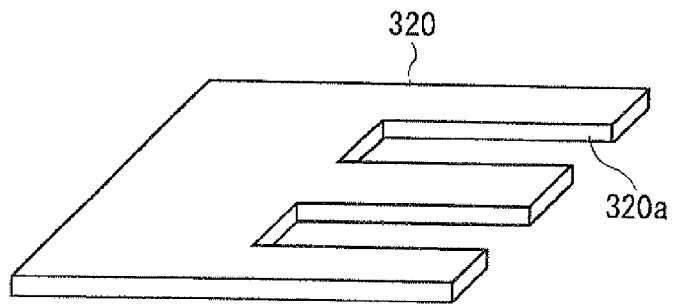
FIG. 10A is a perspective view of a printed circuit board according to the second embodiment.
Figure 10B:
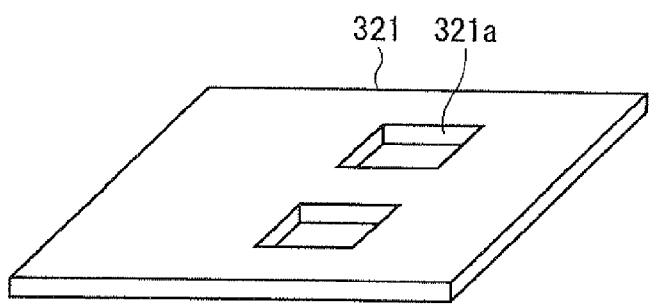
FIG. 10B is a perspective view of a printed circuit board according to another embodiment of the present invention.

In the second embodiment, the printed circuit board 320 having the cutout portions 320*a* which are provided from the end of the printed circuit board 320 as shown in FIG. 10A is used as an example. A printed circuit board used in the second embodiment may have a cutout portion at least at a portion corresponding to the element parts 33*a* of the Hall ICs 33. For example, a printed circuit board 321 having windows 321*a* as shown in FIG. 10B may also be used. In the present case, the windows 321*a* can function as cutout portions.

Figure 10C:
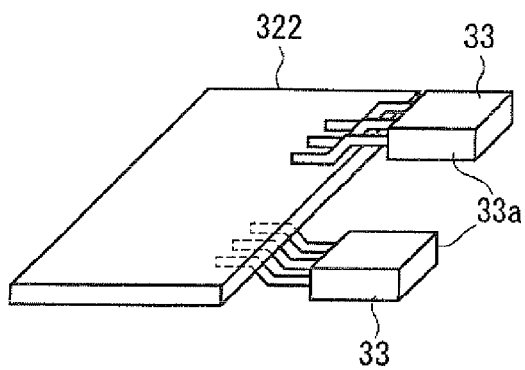
FIG. 10C is a perspective view of a printed circuit board and Hall ICs according to another embodiment of the present invention.

A printed circuit board 322 as shown in FIG. 10C may also be used. When the printed circuit board 322 is used, the element parts 33*a* of the Hall ICs 33 protrude outside from an end portion of the printed circuit board 322.

In the above-described embodiment, the first Hall IC 33 is disposed on the front surface of the printed circuit board 32, 320, 321, or 322 and the second Hall IC 33 is disposed on the rear surface of the printed circuit board 32, 320, 321, or 322. Because the first Hall IC 33 and the second Hall IC 33 are not disposed on the same plane as shown in FIG. 2, the two pairs of the protruding portions 22 are required to be attached at different positions of the ring portions 21 in the vertical direction.

Figure 5B:
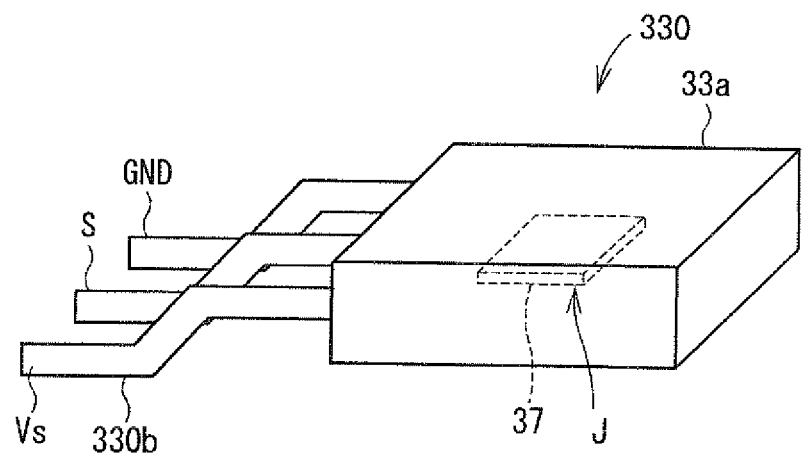
FIG. 5B is a perspective view of a Hall IC according to another embodiment.

Therefore, as shown in FIG. 5B, a Hall IC 330 that has a lead portion 330*b* bent into the same direction as the front surface of the sensing element 37 shown by J may also be formed, and the Hall IC 33 and the Hall IC 330 may also be disposed on the same plane of a printed circuit board.

In the present case, the Hall IC 33 and the Hall IC 330 are required to be handled distinctly. However, because the Hall IC 33 and the Hall IC 330 can be disposed on the same plane, a configuration of the protruding portions 22 can be simple.

In the above-described embodiment, each of the sensor units 30 and 300 includes the connector 31 as a terminal member electrically coupled with an external device. Each of the sensor units 30 and 300 may also include, for example, a harness as a terminal member electrically coupled with an external device.

In the above-described embodiments, each of the sensor units 30 and 300 includes two Hall ICs 33. Each of the sensor unit 30 and 300 may also include single Hall IC or more than two Hall ICs.

What is claimed is:

1. A sensor unit comprising:
a printed circuit board having a conductive pattern, the printed circuit board extending in a planar direction which is perpendicular to a thickness direction of the printed circuit board;
a plurality of Hall ICs disposed on the printed circuit board, each of the plurality of Hall ICs including an element part that detects magnetic flux, the element part arranged in parallel with the planar direction of the printed circuit board, being away from the conductive pattern, and being not opposite to the conductive pattern in the thickness direction of the printed circuit board;
a terminal member disposed on an end portion of the printed circuit board, the terminal member configured to be electrically coupled with an external device;
a capacitor disposed on the printed circuit board; and
a resin member covering at least one of the plurality of the Halls ICs, a portion of the terminal member connected with the printed circuit board, and the capacitor, wherein
the printed circuit board has a plurality of cutout portions,
the plurality of Hall ICs are disposed on the printed circuit board in such a manner that each of the element part corresponds respectively to one of the cutout portions, and
the cutout portions each has a width smaller than a width of the corresponding Hall IC and the Hall ICs are soldered to the printed circuit board such that the Hall ICs respectively straddle the cutout portions,
one of the plurality of Hall ICs is disposed on a front surface of the printed circuit board, and another one of the plurality of Hall ICs is disposed on a rear surface of the printed circuit board, and
the Hall IC disposed on the front surface of the printed circuit board and the Hall IC disposed on the rear surface of the printed circuit board are disposed at different positions in the planar direction of the printed circuit board so that the Hall IC disposed on the front surface and the Hall IC disposed on the rear surface are not opposed to each other in the thickness direction of the printed circuit board,
each of the cutout portions is exposed from the resin member on a side of the printed board which is opposite a side of the printed circuit board that the corresponding Hall IC is located on, and
a first portion of the resin member surrounding each of the cutout portions on the side of the printed circuit board which is opposite the side of the printed circuit board that the corresponding Hall IC is located on has a thickness smaller that a thickness of a second portion of the resin member other than the first portion.

2. A magnetic flux concentrating module comprising:
the sensor unit according to claim 1;
a magnetic flux concentrating ring including a plurality of protruding portions, one of the plurality of protruding portions and another one of the plurality of protruding portions arranged on opposite sides of at least one of the plurality of the Hall ICs;
a shield covering the magnetic flux concentrating ring; and
an outer frame made of resin.

3. The sensor unit according to claim 1, wherein
a thickness of the resin member decreases with a decrease in a distance to the each of the cutout portions on the opposite side from the corresponding Hall IC.

4. The sensor unit according to claim 1, wherein
the resin member has a groove surrounding each of the cutout portions on the opposite side from the corresponding Hall IC, and
the groove has a trapezoidal cross section.

5. The sensor unit according to claim 1, wherein
a portion of the printed circuit board surrounding each of the cutout portions is exposed from the resin member on the opposite side from the corresponding Hall IC.

6. A sensor unit comprising:
a printed circuit board having a conductive pattern, the printed circuit board extending in a planar direction which is perpendicular to a thickness direction of the printed circuit board;
at least one Hall IC disposed on the printed circuit board, the Hall IC including an element part that detects magnetic flux, the element part arranged in parallel with the planar direction of the printed circuit board, being away from the conductive pattern, and being not opposite to the conductive pattern in the thickness direction of the printed circuit board;
a terminal member disposed on an end portion of the printed circuit board, the terminal member configured to be electrically coupled with an external device;
a capacitor disposed on the printed circuit board; and
a resin member covering the Hall IC, a portion of the terminal member connected with the printed circuit board, and the capacitor, wherein
the printed circuit board has at least one cutout portion,
the Hall IC is disposed on the printed circuit board in such a manner that the element part corresponds to the cutout portion,
the cutout portion has a width smaller than a width of the Hall IC, and the Hall IC is soldered to the printed circuit board such that the Hall IC Straddles the cutout portion,
the cutout portion is exposed from the resin member on a side of the printed circuit board which is opposite a side of the printed circuit board that the Hall IC is located on, and
a first portion of the resin member surrounding the cutout portion on the side of the printed circuit board which is opposite the side of the printed circuit board that the Hall IC is located on has a thickness smaller thickness of a second portion of the resin member other that the first portion.

* * * * *